United States Patent
Ritter et al.

(10) Patent No.: US 9,203,237 B2
(45) Date of Patent: Dec. 1, 2015

(54) PROTECTION CIRCUIT

(75) Inventors: Hans-Martin Ritter, Hamburg (DE); Achim Werner, Hamburg (DE)

(73) Assignee: NXP B.V., Eindhoven (NL)

( * ) Notice: Subject to any disclaimer, the term of this patent is extended or adjusted under 35 U.S.C. 154(b) by 107 days.

(21) Appl. No.: 13/454,862

(22) Filed: Apr. 24, 2012

(65) Prior Publication Data

US 2013/0279053 A1  Oct. 24, 2013

(51) Int. Cl.
*H02H 9/04* (2006.01)
*H01L 27/02* (2006.01)
*H01L 29/74* (2006.01)

(52) U.S. Cl.
CPC ........... *H02H 9/046* (2013.01); *H01L 27/0262* (2013.01); *H01L 29/7436* (2013.01)

(58) Field of Classification Search
CPC . H02H 9/046; H01L 27/0262; H01L 29/7436
USPC .................................... 361/56, 91.1
See application file for complete search history.

(56) References Cited

U.S. PATENT DOCUMENTS 5,343,053 A * 8/1994 Avery ........................... 257/173
5,592,415 A * 1/1997 Kato et al. ............... 365/185.01
5,684,306 A * 11/1997 Iwamuro ....................... 257/147
6,671,153 B1 * 12/2003 Ker et al. ...................... 361/111
6,674,129 B1   1/2004 Colclaser et al.

FOREIGN PATENT DOCUMENTS

CN    1347568 A    5/2002

OTHER PUBLICATIONS

Thyristor Theory and Design Consideratioins, On Semicondcutor, 2005, SCILLC, pp. 10-11.*
Rod Elliott, How to Use Zener Diodes, AN-008, Jun. 30, 2005, Elliott Sound Products on-line publication, pp. 1-4.*
Ming-Dou Ker, "Overview of On-Chip Electrostatic Discharge Protection Design With SCR-Based Devices in CMOS Integrated Circuits", IEEE Transactions on Device and Materials Reliability, vol. 5, No. 2, Jun. 2005.

* cited by examiner

*Primary Examiner* — Zeev V Kitov

(57) ABSTRACT

Circuit protection is provided. In accordance with one or more example embodiments, a thyristor-based circuit and a diode-based circuit are connected in series between an internal circuit terminal and reference terminal, for protecting the internal circuit terminal against circuit stresses such as overvoltage and/or overcurrent, as may be associated with electrostatic discharge. The thyristor and diode-based circuits operate in a first mode at which leakage current is limited by the thyristor, and in a second (protection) mode in which a voltage at the internal terminal exceeds a threshold level at which the thyristor-based circuit operates in a forward-biased mode and the diode operates in a breakdown mode, for shunting current between the internal circuit terminal and reference terminal.

21 Claims, 14 Drawing Sheets

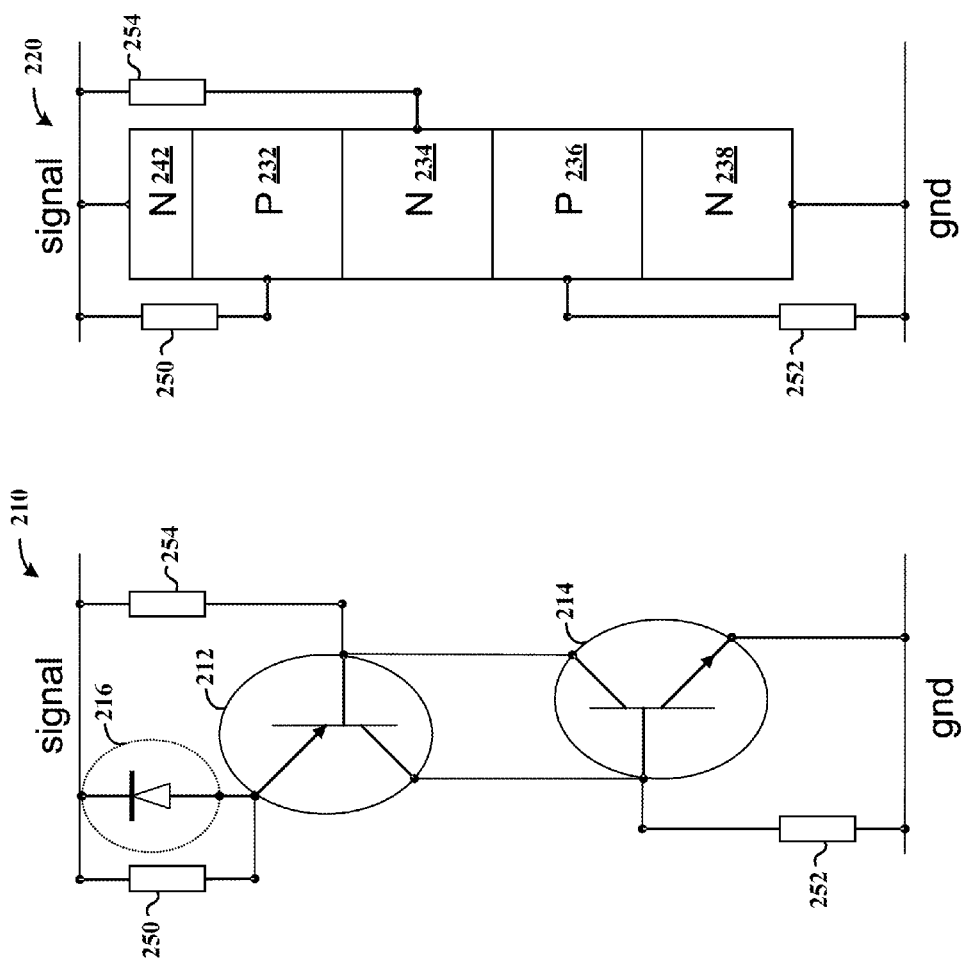

PROTECTION CIRCUIT

Aspects of various embodiments of the present invention are directed to protecting against overvoltage or overcurrent conditions.

Many circuits are susceptible to electrical overstress as may relate to electrostatic discharge (ESD) or other overvoltage or overcurrent conditions that can be damaging. To address such overstress, protection circuits that generally operate like a switch are used to bypass/shunt current during an electrical overstress condition. In the case of an electrical overstress, such protection circuits switch to a low ohmic state, to connect an input (or other circuit) to a reference terminal such as a ground, common or lower-level power-rail terminal, thus shunting excessive charge to a place where it does not harm the IC.

A SCR ("silicon controlled rectifier") has been attractive as a protection device in CMOS-based integrated circuits due to their low clamping voltage and the resulting high current capability. However, such circuits can be susceptible to latch-up problems, particularly at low clamping voltage. Such problems can require that the SCR be tuned so that it operates at a high clamping voltage and/or high trigger current by deliberately "frustrating" the thyristor action (e.g., by reducing the gains of bipolar transistors making up the SCR by increasing the base width).

However, the working performance of such SCRs depends heavily on parasitic parameters that are not well controlled in standard CMOS processes. This makes it difficult or impossible to transfer SCR-based protection concepts from one production center to another. Furthermore the turn-on time of such an SCR can be rather high due to the low gains of the associated bipolar transistors. Generally, low-voltage diodes may exhibit undesirable leakage current, and high-voltage diodes can require undesirably high clamping voltages. These and other matters have presented challenges to the implementation of SCRs and other circuit components with protection circuits, for a variety of applications.

Various example embodiments are directed to protection circuits and their implementation, as may be applicable to overvoltage/overcurrent type conditions and addressing challenges such as those discussed above.

According to an example embodiment, a protection circuit includes a thyristor-based circuit having anode and cathode end regions separated by two base regions, first and second resistors respectively connected between one of the base regions and an internal circuit terminal, and between the other one of the base regions and a reference terminal, and a diode-based circuit connected in series with the thyristor between the internal circuit terminal and the reference terminal. The diode-based circuit and the thyristor-based circuit operate in a first mode at which a voltage between the internal circuit and reference terminals is below a first voltage level at which the thyristor-based circuit breaks down, and in a second mode in which the voltage between the internal circuit and reference terminals exceeds the first voltage level. In the second mode, the thyristor-based circuit operates in a forward-biased mode and the diode operates in a breakdown mode to conduct current between the internal circuit terminal and reference terminal. A holding voltage in the second mode is based upon a sum of a breakdown voltage of the diode-based circuit and a holding voltage for maintaining the thyristor-based circuit in the forward-biased mode.

Another example embodiment is directed to a protection circuit for use in a circuit including an internal circuit terminal subject to at least one of an overvoltage, overcurrent or electrostatic discharge condition. The protection circuit includes first and second resistors and a plurality of doped regions of opposite polarity forming p-n junctions therebetween, the plurality of doped regions a thyristor and a diode. The thyristor has an anode and a cathode separated by two base regions, and the diode has an anode and a cathode, one of which includes one of the anode and cathode of the thyristor and the other of which is connected to one of the internal circuit terminal and reference terminal. The first resistor is between one of the base regions and the internal circuit terminal, and the second resistor is between another one of the base regions and reference terminal. The thyristor switches to a breakdown state in response to a voltage drop across one of the resistors being higher than a forward voltage of a p-n junction between an anode of the thyristor and one of the base regions immediately adjacent the anode. The thyristor and diode operate in three modes as follows. In a first mode at which a voltage at the p-n junction is below the forward voltage, current flow between the internal circuit terminal and reference terminal is limited by a leakage current through the thyristor. In the second mode, in response to the forward voltage being presented to the p-n junction, the thyristor switches to a low-resistance state in which the p-n junction operates in a forward-biased state and flows current between the internal circuit terminal and reference terminal, via the p-n junction and the diode. In the third mode, after switching to the low-resistance state, the thyristor/diode combination operates in a hold state and continues to flow current between the internal circuit terminal and reference terminal (via all doped regions of the thyristor), while the voltage between the internal circuit terminal and reference terminal remain above a holding voltage. This holding voltage is based upon a sum of the clamping voltages of the thyristor-based and diode-based circuits.

Another example embodiment is directed to a protection circuit having a diode, a thyristor, first and second resistors respectively connected between a first base region of the thyristor and an internal circuit terminal susceptible to an overcurrent or overvoltage condition, and between a second base region of the thyristor and a reference terminal. The diode is connected in series with the thyristor between the internal circuit terminal and the reference terminal, with one of the thyristor and diode being directly connected to the internal circuit terminal and the other of the thyristor and diode being directly connected to the reference terminal. The thyristor, resistors and diode circuits operate together in three modes as follows. The circuits operate in a first mode in which a voltage presented at the internal circuit terminal is insufficient to forward bias a p-n junction of the thyristor, and in which leakage current between the internal circuit terminal and reference terminal is limited to a leakage current of the thyristor. The circuits operate in a second breakdown mode by, in response to a breakdown voltage presented at the internal circuit terminal causing the p-n junction of the thyristor to switch to a forward biased state, switching the diode into a breakdown state and conducting current between the internal circuit terminal and the reference terminal. After switching the diode into the breakdown state, the circuits operate in the third mode by continuing to conduct current between the internal circuit terminal and the reference terminal in response to a voltage presented at the internal circuit terminal being at least as high as a holding voltage. This holding voltage has a value that is the sum of the clamping voltages of the thyristor and diode, and is less than the breakdown voltage.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which:

FIG. 1A and FIG. 1B respectively show a schematic and structure of a protection circuit having a thyristor-based circuit and a diode, in accordance with example embodiments of the present invention;

FIG. 2A and FIG. 2B respectively show a schematic and structure of a protection circuit with a diode between a thyristor-based circuit and an internal circuit terminal susceptible to an overvoltage/overcurrent condition, in accordance with another example embodiment of the present invention;

FIG. 3A and FIG. 3B respectively show a schematic and structure of a protection circuit with a diode between a thyristor-based circuit and a ground terminal, in accordance with another example embodiment of the present invention;

Figure 11:
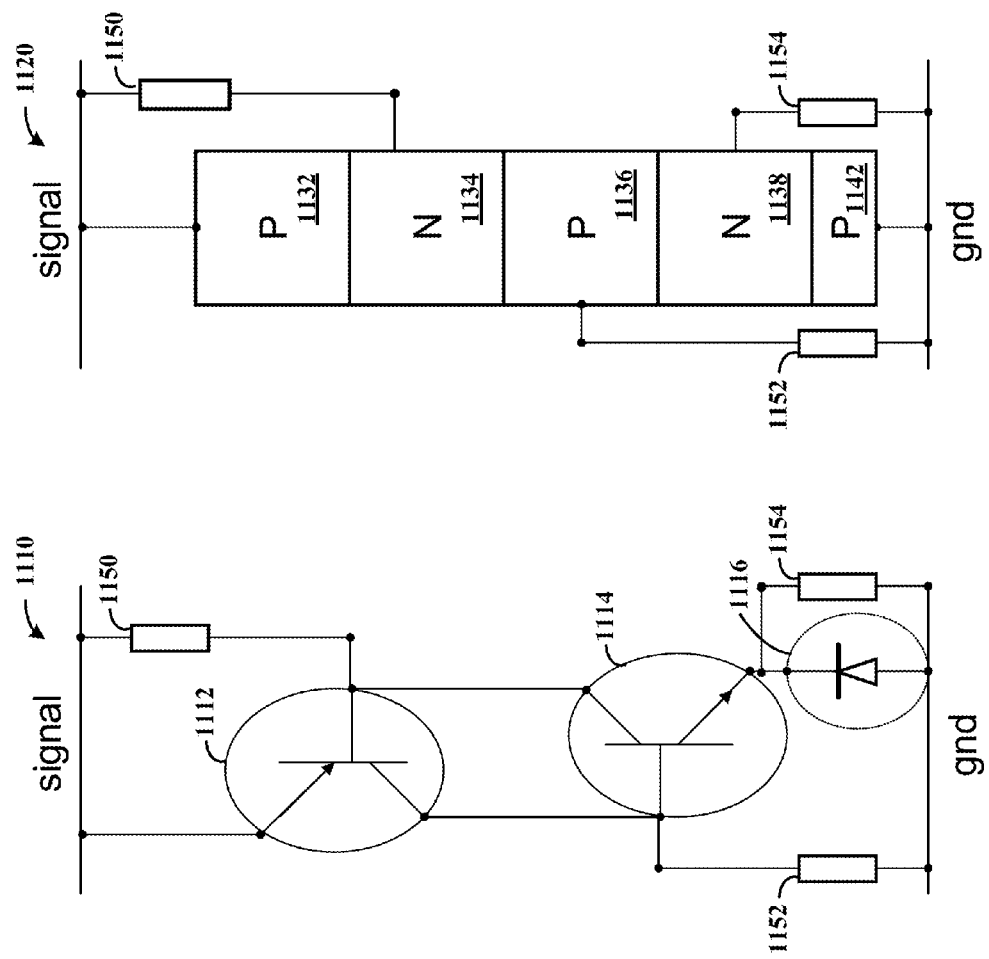
Figure 12:
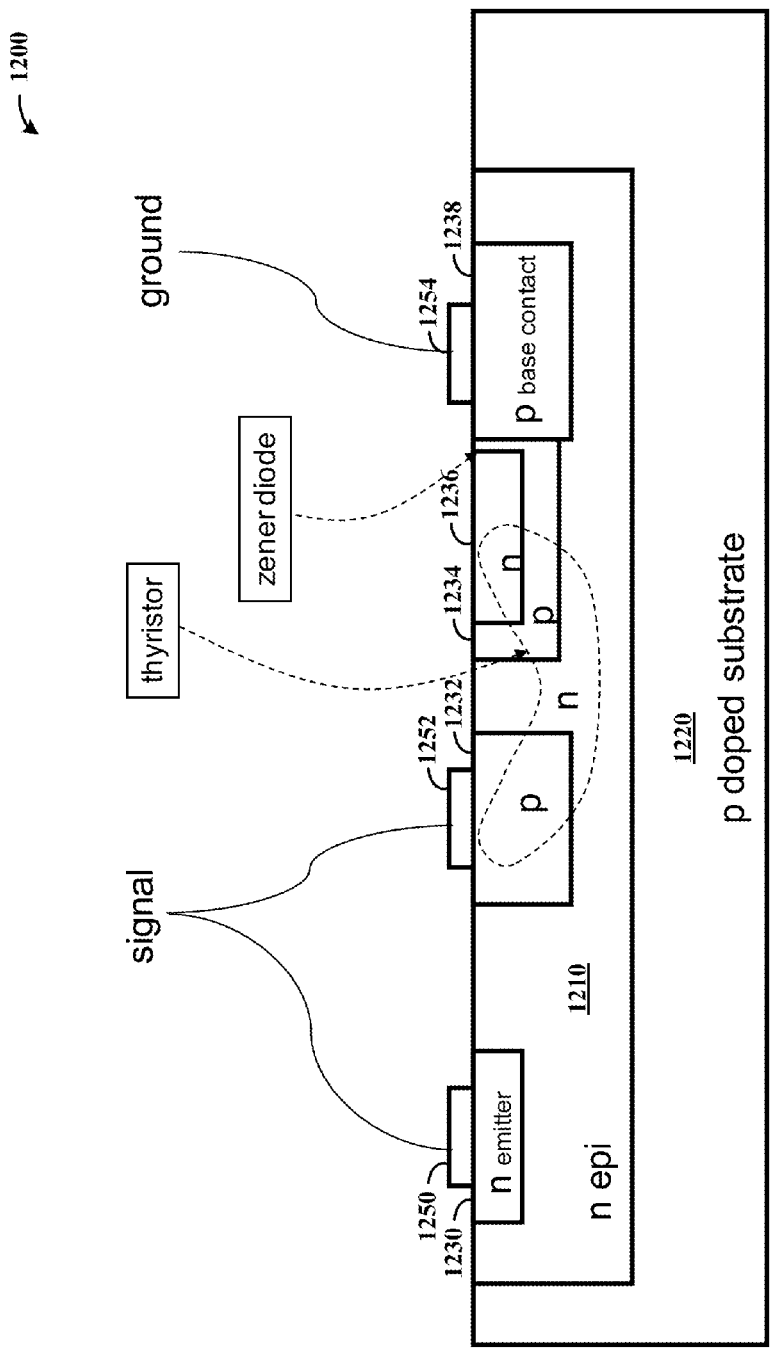
Figure 13:
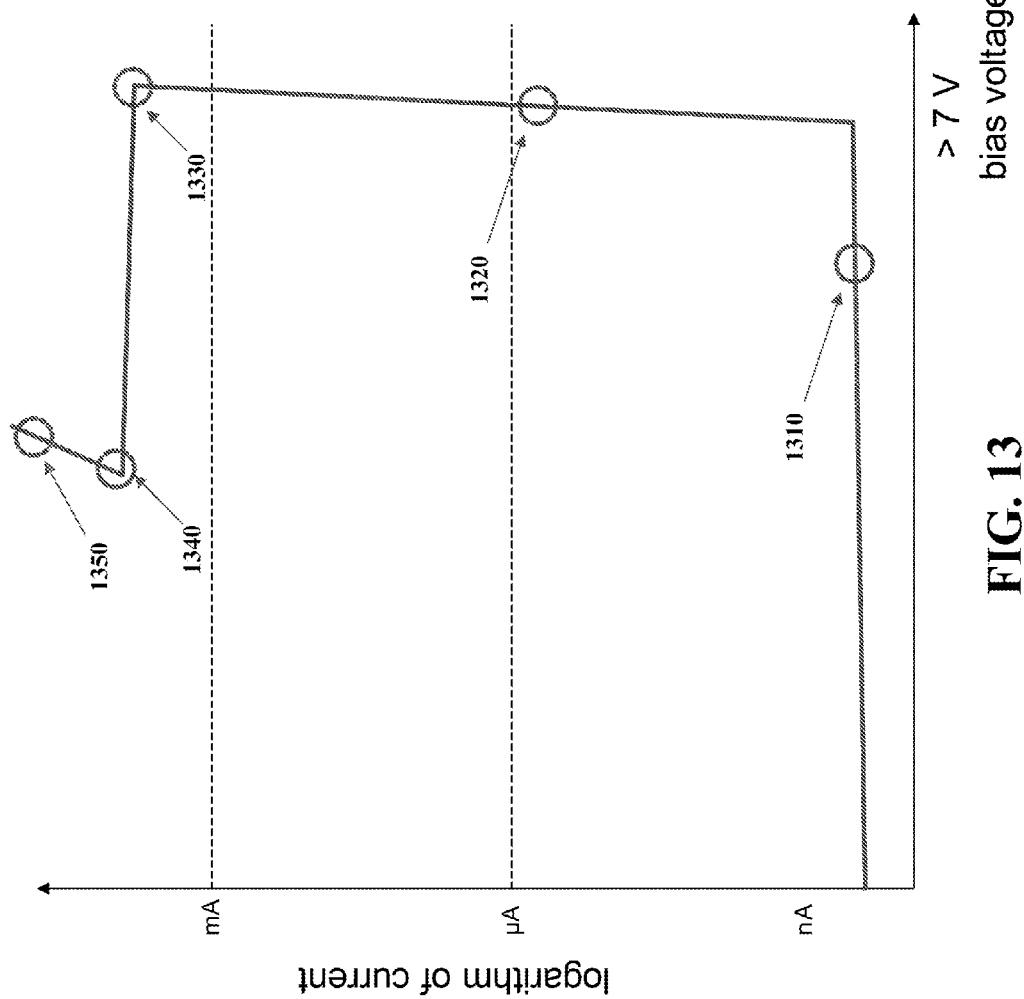
Figure 14:
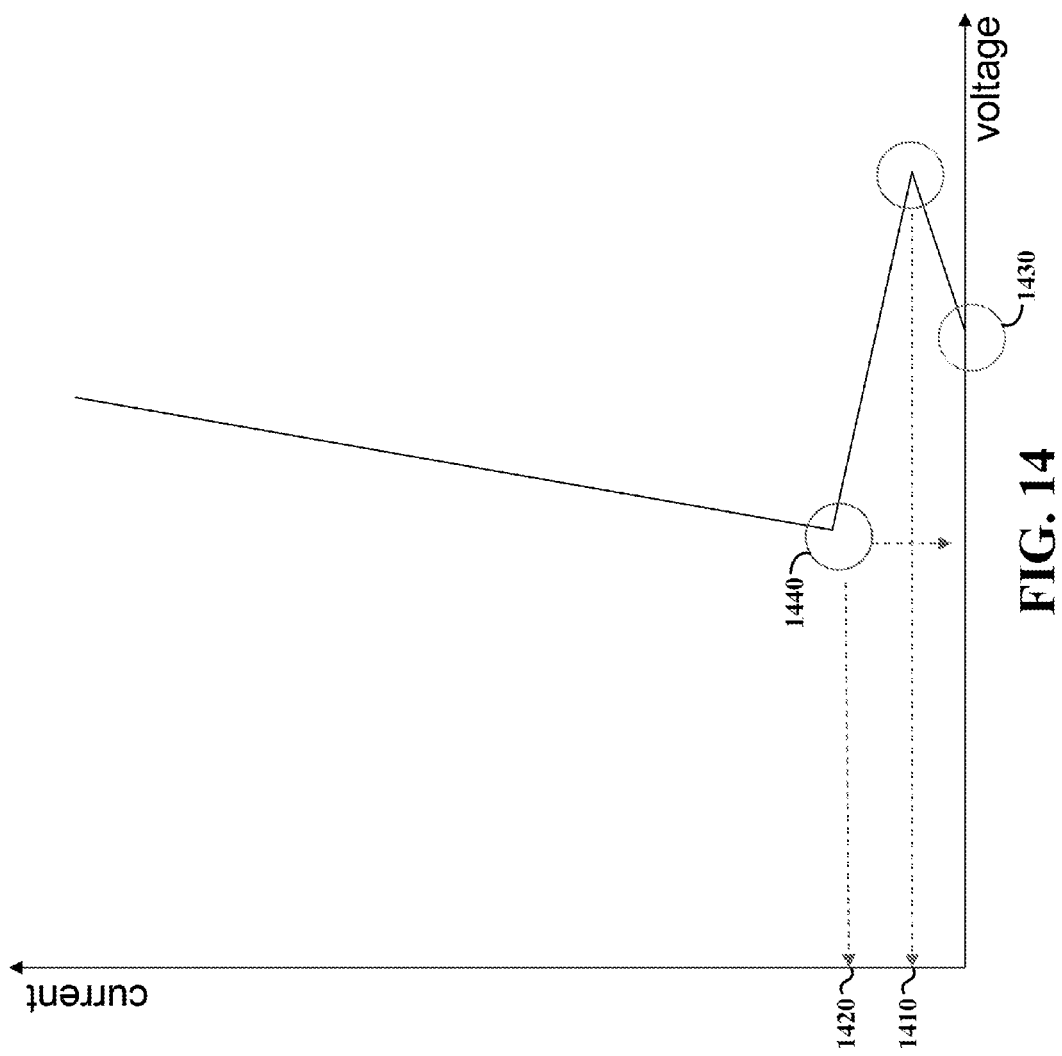

FIGS. 11A and 11B respectively show a schematic and structure of a protection circuit with a diode and resistor in parallel between a thyristor-based circuit and a ground terminal (or other voltage level), in accordance with another example embodiment of the present invention;

FIG. 12 shows a cross section of another protection circuit, in accordance with another example embodiment of the present invention;

FIG. 13 shows a plot of the operation of a protection circuit including a diode and thyristor in series, in accordance with another example embodiment of the present invention; and FIG. 14 shows a plot of current versus voltage for a protection circuit having a thyristor and zener diode in series, in accordance with another example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

Aspects of the present invention are believed to be applicable to a variety of different types of devices, systems and arrangements involving protection circuits. While the present invention is not necessarily so limited, various aspects of the invention may be appreciated through a discussion of examples using this context.

Various example embodiments are directed to a circuit protection circuit including a low voltage diode and a thyristor in series, exhibiting a well defined clamping voltage that can be tuned (set during manufacture) to desired levels for high latch-up immunity. Moreover, the use of the diode with a set breakdown voltage facilitates the setting/optimization of other aspects of the thyristor, which can address problems such as those described above. In some implementations, the thyristor is robust with respect to implementation with parasitic and non-controlled diffusion parameters, and to facilitate implementation in a variety of different applications and environments, with a desirable (fast) switching speed. Leakage current through the diode is limited by the thyristor in series, also addressing leakage issues as discussed above.

At least one of the open nodes (base regions) of the thyristor is connected to an internal (signal) terminal for which overcurrent/overvoltage is to be provided, or to a reference terminal. In some implementations, both open nodes are connected with respective resistors to one of the terminals. The values of the resistors together with the gains of the respective transistors (consecutive PNP and NPN regions of the thyristor) influence the breakdown characteristics of the thyristor.

The resulting holding voltage of the protection circuit is the sum of the breakdown voltage of the diode and the holding voltage of the thyristor. Accordingly, the breakdown voltage of the diode can be set to a level near a desired holding voltage, with the added holding voltage of the thyristor being relatively low (e.g., less than 1 V). This voltage can also be set at a level that is higher than a corresponding supply voltage, to mitigate/avoid latch-up.

As used herein, a reference terminal refers to a terminal that is at ground level, at a common level, or at a voltage level corresponding to a different supply/circuit with a voltage level that is different (lower), relative to the signal/internal circuit at which protection is being provided.

In a more particular example embodiment, an overvoltage/overcurrent-type protection circuit includes a thyristor-based circuit having anode and cathode end regions separated by two base regions, first and second resistors respectively connected between one of the base regions and an internal circuit terminal and between the other one of the base regions and ground, and a diode-based circuit connected in series with the thyristor between the internal circuit terminal and the ground terminal.

The diode-based circuit and the thyristor-based operate in a first mode at which a voltage between the internal circuit and ground terminals is below a first voltage level, and in which leakage current is limited by leakage through the thyristor (e.g., neither the diode-based circuit nor the thyristor-based circuit is in a current-passing mode).

The diode-based circuit and the thyristor-based circuits operate in a second mode in which the voltage between the internal circuit and ground terminals exceeds the first voltage level. In this second mode, the thyristor-based circuit operates in a forward-biased mode and the diode operates in a breakdown mode to conduct current between the internal circuit terminal and ground. The circuits also operate in a holding mode (e.g., as part of this second mode), at a holding voltage that is based upon a sum of a breakdown voltage of the diode-based circuit and a holding voltage of the thyristor-based circuit. This holding mode permits current flow while operating at a voltage level that is lower, relative to a voltage level at which the thyristor switches into a forward-biased stated and the diode enters breakdown.

The diode-based circuit is coupled between the internal circuit terminal and the thyristor-based circuit in certain embodiments, and is connected between the thyristor-based circuit and ground in other embodiments. In one such embodiment, the diode-based circuit includes anode and cathode regions of opposite polarity, with the cathode connected to the internal terminal and the anode including at least a portion of the anode end region of the thyristor-based circuit. In another such embodiment, the diode-based circuit includes anode and cathode regions of opposite polarity, with the anode connected to ground and the cathode including at least a portion of the cathode end region of the thyristor-based circuit.

The thyristor-based circuit facilitates operation of the protection circuit while mitigating undesirable current leakage when not in a high-conductance (e.g., current-passing/electrostatic discharge) mode. In some embodiments, the thyristor-based circuit operates in the first mode to limit leakage current through the diode-based circuit to a current level that is less than half a leakage current level of the diode. These aspects can be carried out to facilitate the use of a diode-based circuit with a desirable breakdown voltage, which can be set generally independently of any current leakage aspects.

In various implementations, the diode-based circuit switches to a current-passing state in response to a voltage level at the internal circuit terminal exceeding a threshold voltage. This threshold voltage may, for example, be set to correspond to a voltage level at which internal circuits coupled to the internal circuit node may be damaged, and can be tuned (e.g., during manufacture) accordingly. In the current-passing state, the diode-based circuit shunts current from the internal circuit terminal to the ground terminal via the thyristor-based circuit. In a particular implementation, the thyristor-based circuit switches to a current-passing state in response to a voltage across the thyristor-based circuit that is less than 1V, and the diode-based circuit switches to a current-passing state in response to a voltage across the diode that is greater than 3V.

Another example embodiment is directed to a circuit having thyristor-based and diode-based circuits in consecutive doped regions of opposite polarity, and resistors coupled thereto, for use in a circuit including an internal circuit terminal subject to at least one of overvoltage, overcurrent or electrostatic discharge conditions. The doped regions form p-n junctions therebetween, respectively of the thyristor-based and diode-based circuits.

The thyristor-based circuit has an anode and a cathode separated by two base regions, with one of the base regions connected between the first resistor and the internal circuit terminal, and the other one of the base regions being connected between the second resistor and a ground terminal. The anode, cathode and base regions are connected between the internal circuit terminal and ground, and pass current from the internal circuit terminal to ground in response to a voltage applied to the input node being higher than a forward voltage of a p-n junction between an anode of the thyristor and one of the base regions immediately adjacent the anode. In some implementations, this forward voltage of the p-n junction is controlled by a trigger circuit, such as a diode, connected to one of the corresponding regions at the p-n junction.

The diode-based circuit has an anode and a cathode, one of which includes, is directly connected to and/or is part of an anode and cathode of the thyristor-based circuit. The other one of the anode and cathode is connected to either the internal circuit terminal and ground.

The diode-based and thyristor-based circuits operate in two modes, including a first mode for responding to at least one of an overvoltage, overcurrent and ESD condition at the internal circuit terminal. In this first mode, the diode-based and thyristor-based circuits switch to a low-resistance state in which the p-n junction between the anode of the thyristor and the one of the base regions immediately adjacent the anode operates in a forward-biased state, and in which current flows between the internal circuit terminal and ground via the plurality of doped regions. In a second mode, the diode-based and thyristor-based circuits operate in a hold state in which current flowing between the internal circuit terminal and ground via the plurality of doped regions is limited by the breakdown voltage of the diode.

In some embodiments, the thyristor-based circuit limits leakage current through the diode-based circuit to a current level that is less than half a leakage current level of the diode. This approach can be carried out, for example, to facilitate operation of the diode at a breakdown voltage that can be tuned to a desirable breakdown level relative to a circuit to which protection is provided, without concern about leakage current through the diode-based circuit in using the thyristor-based circuit to mitigate/limit such leakage current (via connection between the internal circuit node and ground being necessarily through the thyristor-based circuit).

The respective diode-based and thyristor-based circuits are coupled between the internal circuit node and ground in different manners, to suit different applications, in accordance with different embodiments. In some embodiments, the cathode of the diode-based circuit is connected to the internal circuit terminal, the anode of the diode-based circuit is shared with the anode of the thyristor-based circuit, and the cathode of the thyristor-based circuit is connected to ground. In other embodiments, the anode of the diode-based circuit is connected to ground, the cathode of the diode-based circuit is shared with the cathode of the thyristor-based circuit, and the anode of the thyristor-based circuit is connected to the internal circuit node.

Figure 1B:
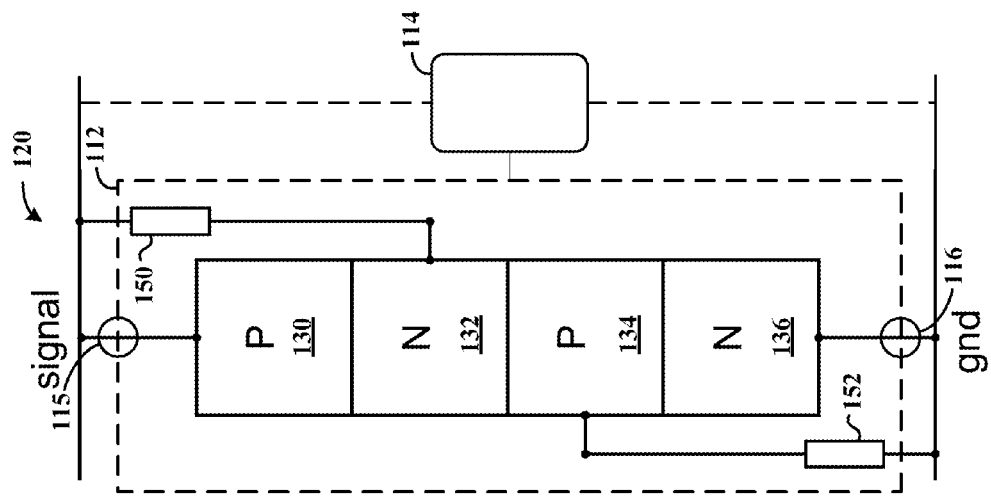
Figure 1A:
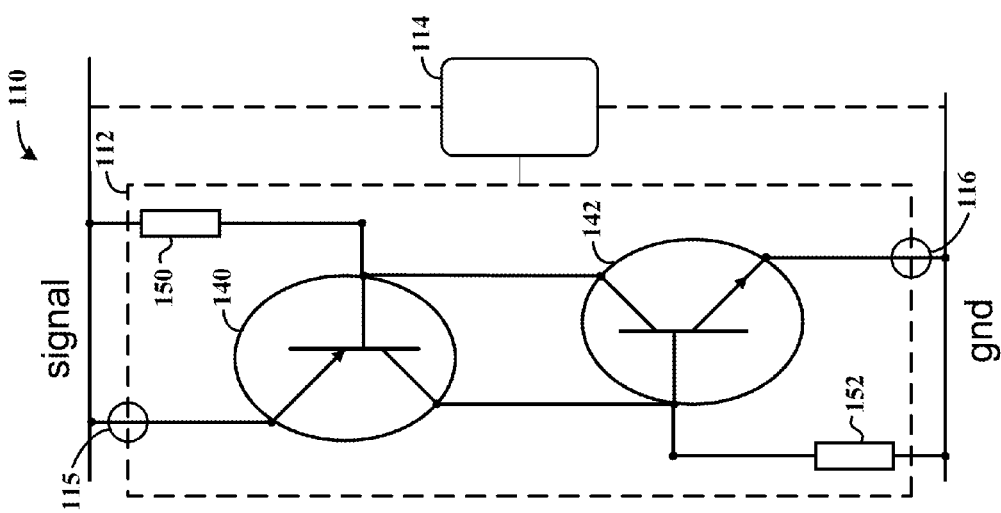

Turning now to the Figures, FIG. 1A and FIG. 1B respectively show a circuit schematic 110 and corresponding circuit structure 120 of a protection circuit having a thyristor-based circuit and a diode, in accordance with other example embodiments of the present invention. The protection circuit includes a thyristor-based circuit 112 connected to a signal and/or ground line via a diode-based circuit such as circuit 114 at one or both of locations 115 and 116 (e.g., with two such diode-based circuits being implemented for certain embodiments, in which the thyristor-based circuit 112 is connected to each of the signal and ground lines via respective ones of the diode-based circuits). The thyristor-based circuit 112 can be referred to as a SCR (silicon controlled rectifier), and includes a sequence of four alternately-doped semiconductor regions 130, 132, 134 and 136 as shown in FIG. 1B. These alternately-doped semiconductor regions can be viewed as a combination of two bipolar transistors 140 and 142 as shown in FIG. 1A. The base of bipolar transistor 140 (N-type region 132) is connected to a signal line terminal via resistor 150, and the base of bipolar transistor 142 (P-type region 134) is connected to a ground terminal via resistor 152. In some implementations, only one of resistors 112 and 152 is implemented, allowing the other base region (to which no resistor is connected) to float.

The thyristor-based circuit, as well as (or including) the resistors can be optimized for a desired holding/clamping voltage, without necessarily considering issues such as those discussed above with respect to latch-up problems. The diode-based circuit 114 provides a low breakdown voltage in series with the thyristor-based circuit between the signal and ground lines. The resulting holding voltage of the protection device is the sum of the breakdown voltage of the diode-based circuit (e.g., 3 V) and the holding voltage of the thyristor-based circuit (e.g., <1 V). Accordingly, a holding voltage in the range of 3 to 6 Volts can be achieved without the need to deteriorate the thyristor-based circuit. In this context, both a useful holding voltage and a very fast turn-on time can be achieved. This approach also facilitates the transfer of products from one diffusion center to another, with less concern for uncontrolled parasitic process parameters that may affect the operation of circuitry.

FIGS. 2A and 2B respectively show a schematic 210 and structure 220 for a protection circuit having a diode connected in series between a thyristor-based circuit and an internal circuit terminal (signal line), in accordance with another example embodiment. The thyristor-based circuit includes PNPN regions 232, 234, 236 and 238 as shown in FIG. 2B, and is also represented by bipolar transistors 212 and 214 in FIG. 2A. The diode includes PN regions 232 and 242 as shown in FIG. 2B, and is also represented in FIG. 2A by diode 216. The P-type region 232, which is shared by the thyristor (at the emitter of BJT 212) and the diode 216, is connected to the signal line via resistor 250 (in some implementations, resistor 250 is omitted). The N-type region 234 (at the base of the BJT 212 and the collector of BJT 214) is also connected to the signal line, but via resistor 254. The P-type region 236 (at the base of BJT 214) is connected to ground via resistor 252. As discussed above, the thyristor, diode and resistors can be selected/implemented to achieve desired operational characteristics of the protection circuit.

Figures 3A, 3B:
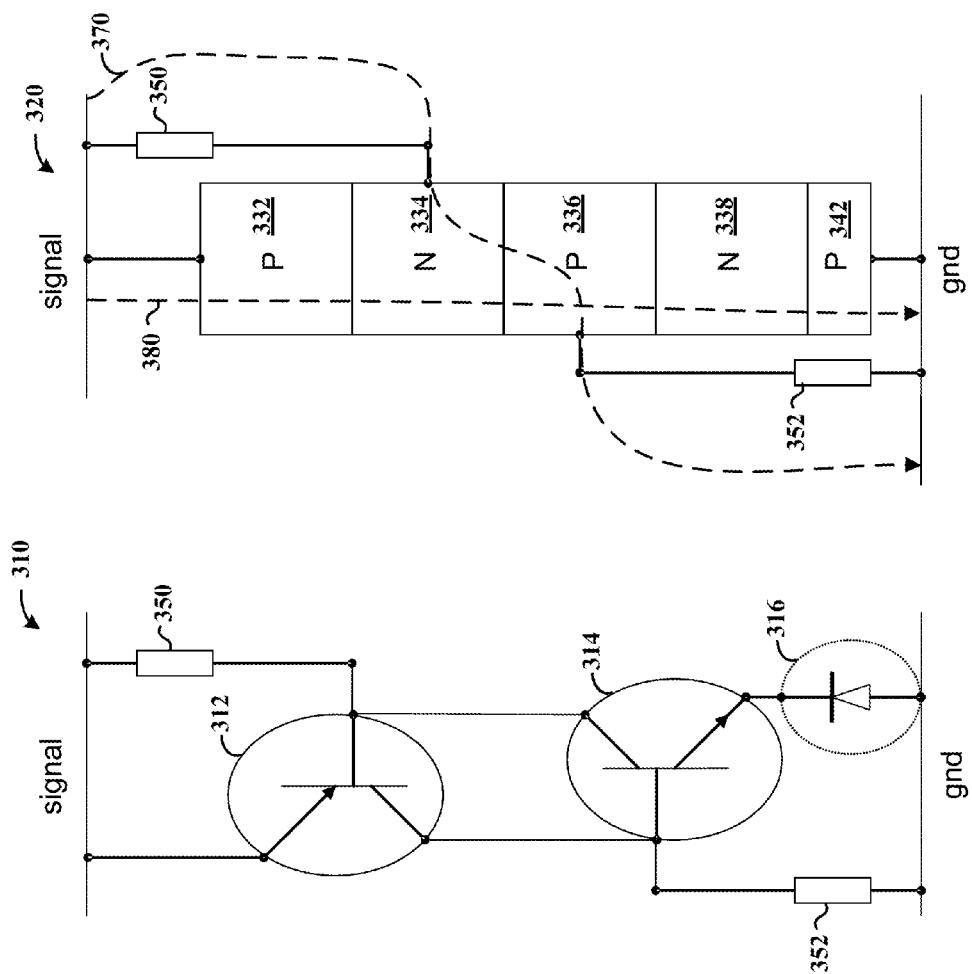

FIGS. 3A and 3B respectively show a schematic 310 and structure 320 of a protection circuit with a diode between a thyristor-based circuit and a ground terminal (or other voltage level), in accordance with another example embodiment. The thyristor-based circuit includes PNPN regions 332, 334, 336 and 338 as shown in FIG. 3B, and is also represented by bipolar transistors 312 and 314 in FIG. 3A. The diode includes PN regions 338 and 342 as shown in FIG. 3B, and is also represented in FIG. 3A by diode 316. The N-type region 334 (at the base of BJT 312) is connected to the signal line via resistor 350. The P-type region 336 (at the base of the BJT 314) is connected to the ground terminal via resistor 352. As consistent with the above discussion, the thyristor, diode and resistors can be selected/implemented to achieve desired operational characteristics of the protection circuit.

Example current flow in the OFF (non-conducting) state is shown by a dashed line 370 in FIG. 3B, running from the signal line to ground via resistor 350, n-type region 334, p-type region 336 and resistor 352. Bias voltage is blocked by the central p-n junction (334/336) of the thyristor/SCR, with a relatively small leakage current flowing through resistor 350, p-n junction 334/336 and resistor 352.

Example current flow in the ON (conducting) state is shown by dashed line 380, running from the signal line to ground via the thyristor and zener diode, bypassing resistors 350 and 352. The thyristor (332/334/336/338) is conducting, and thus connects the signal to the cathode of the diode 316, which is conducting (being in the breakdown mode). The clamping voltage is the sum of the voltages across the thyristor (e.g., less than 1 V) and across the diode 316 (e.g., 2.5 V).

In various example embodiments, such as those shown in FIGS. 1-3B above, the nodes (e.g., P-type or N-type regions) as shown are connected in different ways. In some embodiments, one or more of the nodes may be floating, connected to the ground line, connected to the signal line, or to one another. In some instances, one or more of these nodes is connected to a trigger structure (e.g., to an additional diode).

Figure 4:
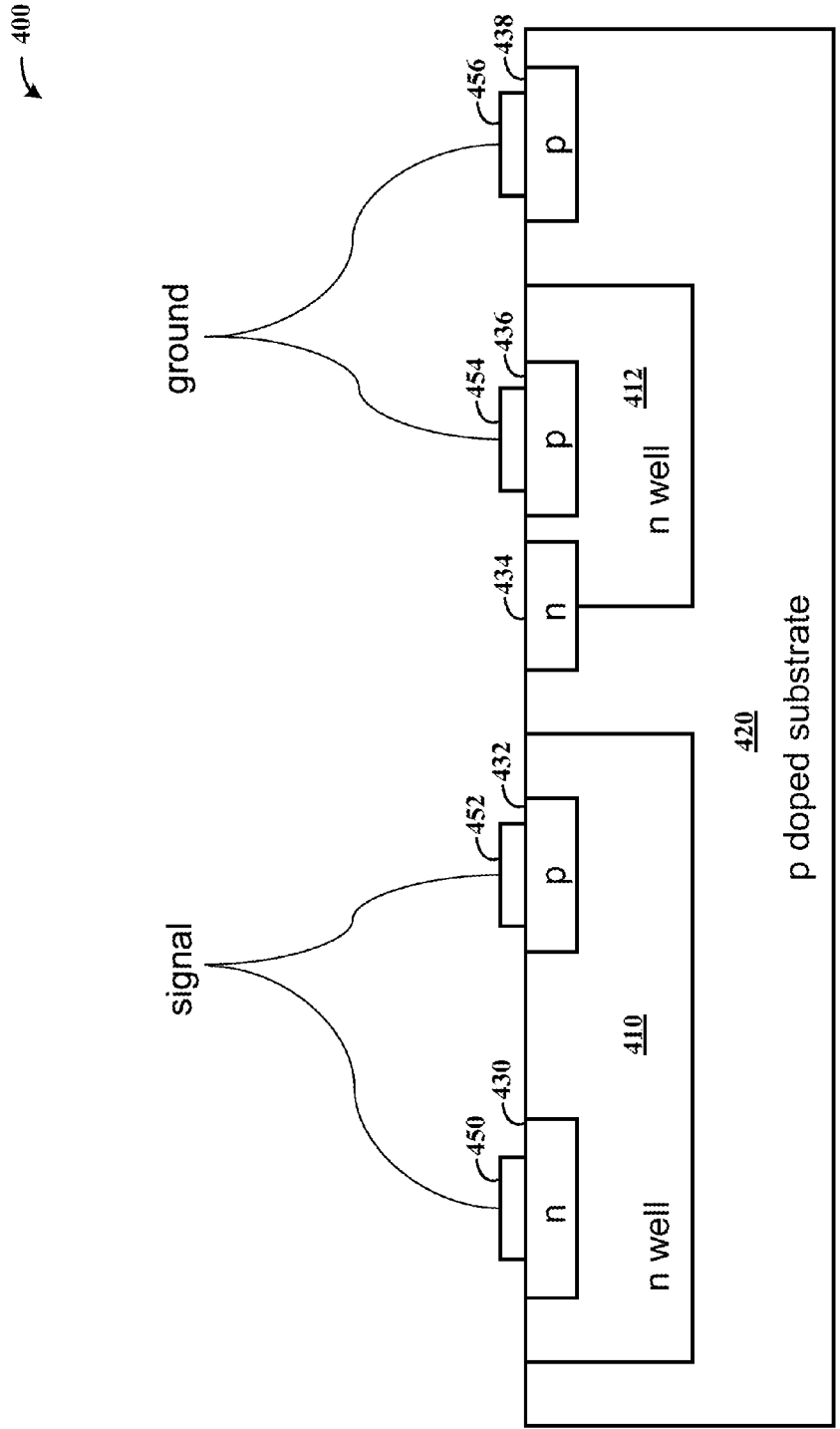
FIG. 4 shows schematic cross section of a protection circuit, in accordance with another example embodiment of the present invention.

FIG. 4 shows schematic cross section of a protection circuit 400 having a thyristor and a diode, in accordance with another example embodiment. The circuit 400 includes n-wells 410 and 412 within a p-doped substrate 420. Alternating n-type and p-type regions 430, 432, 434, 436 and 438 are located in the n-wells and/or p-doped substrate as shown. Contacts 450 and 452 respectively for n-type region 430 and p-type region 432 are connected to a signal terminal. Contacts 454 and 456, respectively for p-type regions 436 and 438, are connected to a ground terminal.

The p-type region 432 that is connected to the signal line, the surrounding n-well 410, and the p-doped substrate 420 form a pnp-transistor. The floating n-type region 434 (combined with the floating n-well 412), the p-doped substrate 420 and the n-well 410 on the signal side form an npn-transistor. The respective pnp and npn transistors form the thyristor. The floating n-type region 434 and the p-type region 436 connected to the ground terminal form the diode.

The protection circuit 400 can be formed using one or more of a variety of approaches. In some embodiments, a CMOS-diffusion-process is used to define the n-type and p-type regions, with the n-well of the PMOS (420) being used for defining the n-wells 410 and 412. In some implementations, the thyristor is designed with minimum distances between the four diffusion areas, to minimize turn-on time and on-resistance. The breakdown voltage of the diode can be chosen in a wide range by adjusting the distance between the floating n-type region 434 and the p-type region 436 connected to ground.

Figure 5:
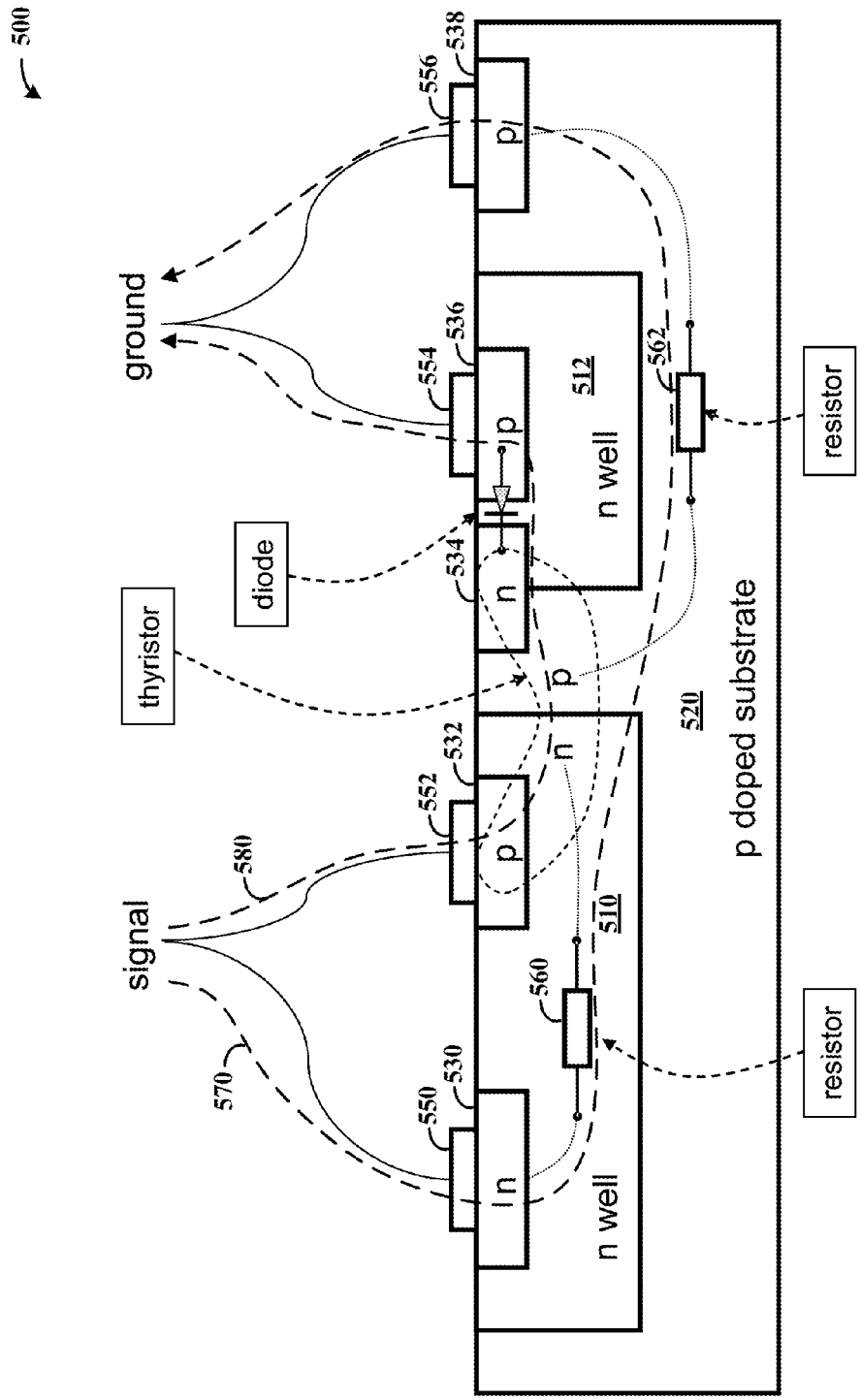
FIG. 5 shows schematic cross section of a protection circuit having diodes and two resistors, in accordance with another example embodiment of the present invention.

FIG. 5 shows a cross section of a protection circuit 500 having diodes and two resistors, in accordance with another example embodiment. The circuit 500 may, for example, be implemented in accordance with the circuit shown in FIGS. 3A and 3B. The circuit 500 includes n-wells 510 and 512 within a p-doped substrate 520. Alternating n-type and p-type regions 530, 532, 534, 536 and 538 are located in the n-wells and/or p-doped substrate as shown. Contacts 550 and 552 respectively for n-type region 530 and p-type region 532 are connected to a signal line. Contacts 554 and 556, respectively for p-type regions 536 and 538, are connected to a ground line. Resistor 560 connects the n-type region 530 with a portion of the n-well 510 that forms part of the thyristor, as discussed above. A resistor 562 couples the portion of the p-doped substrate 520 that forms part of the thyristor with p-type region 538 and, via contact 556, with a ground line. The resistor 560 is an n-well resistor that couples the base of the pnp-transistor resistively to the signal terminal. The resistor 562 is a substrate resistor that couples the base of the npn-transistor resistively to the ground terminal. As described earlier, many other configurations are possible with the circuit 500.

Example current flow in the OFF (non-conducting) state is shown by dashed line 570 running from the signal terminal, through contact 550 and n-type region 530, n-well 510 (and resistor 560) into the p-doped substrate 520 (and resistor 562), and out p-doped region 538 and its respective contact 556 to ground.

Current flow in the ON (conducting) state is shown by dashed line 380, passing from signal, through n-type contact 552 through the thyristor via n-type region 532 and along n-well (base) 510, p-substrate (base) 520, n-type region 534 and out through p-type region 536 and contact 554 to ground.

Figure 6:
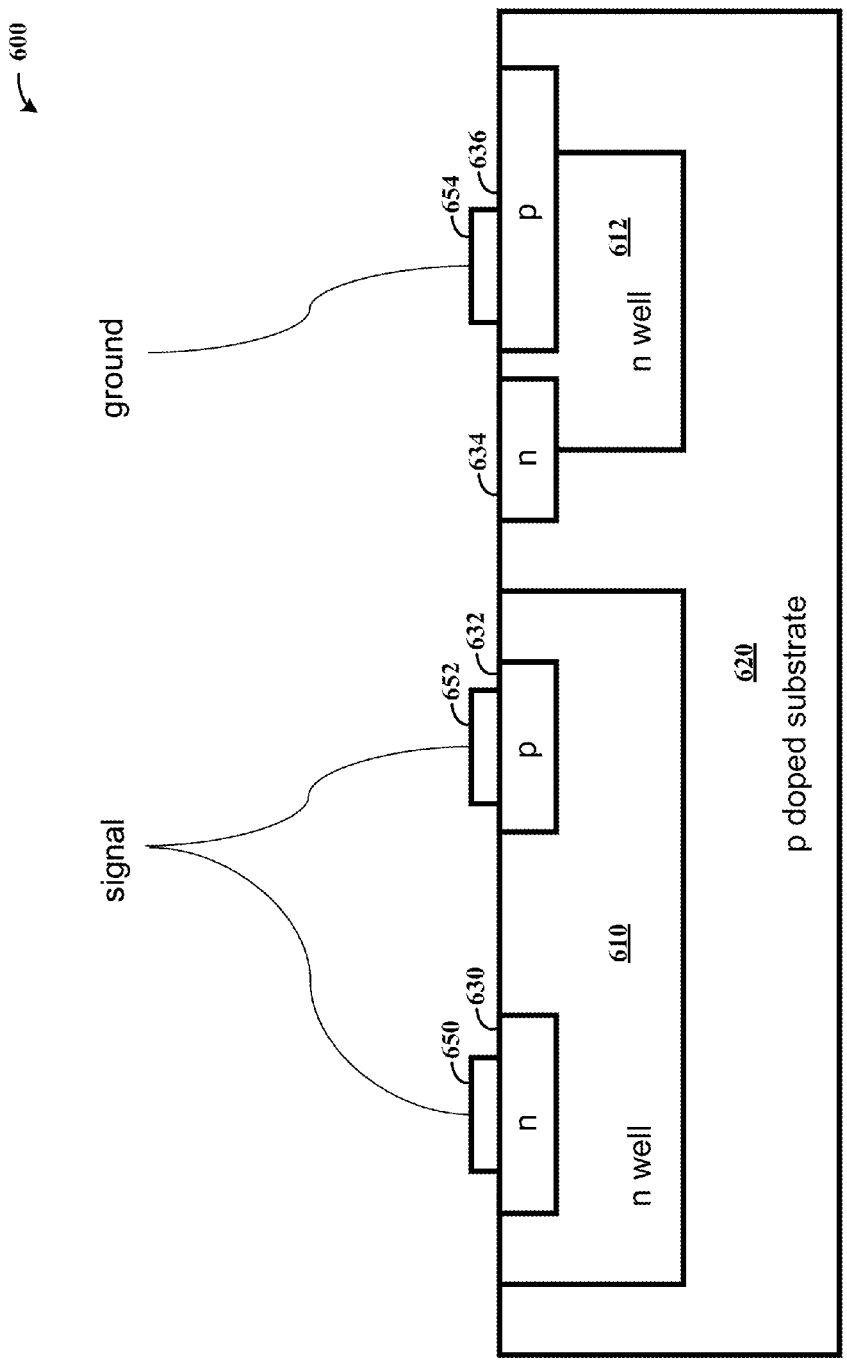
FIG. 6 shows schematic cross section of a protection circuit with a substrate connected to a ground terminal via an extension of a p-doped region, in accordance with another example embodiment of the present invention.

FIG. 6 shows schematic cross section of a protection circuit 600 with a thyristor and a diode as discussed herein, in accordance with another example embodiment. The circuit 600 is similar to the circuit shown in FIG. 4, with similar structures labeled using similar numerals, and with p-type substrate 620 connected to a ground terminal via an extension of p-doped region 636.

Figure 7:
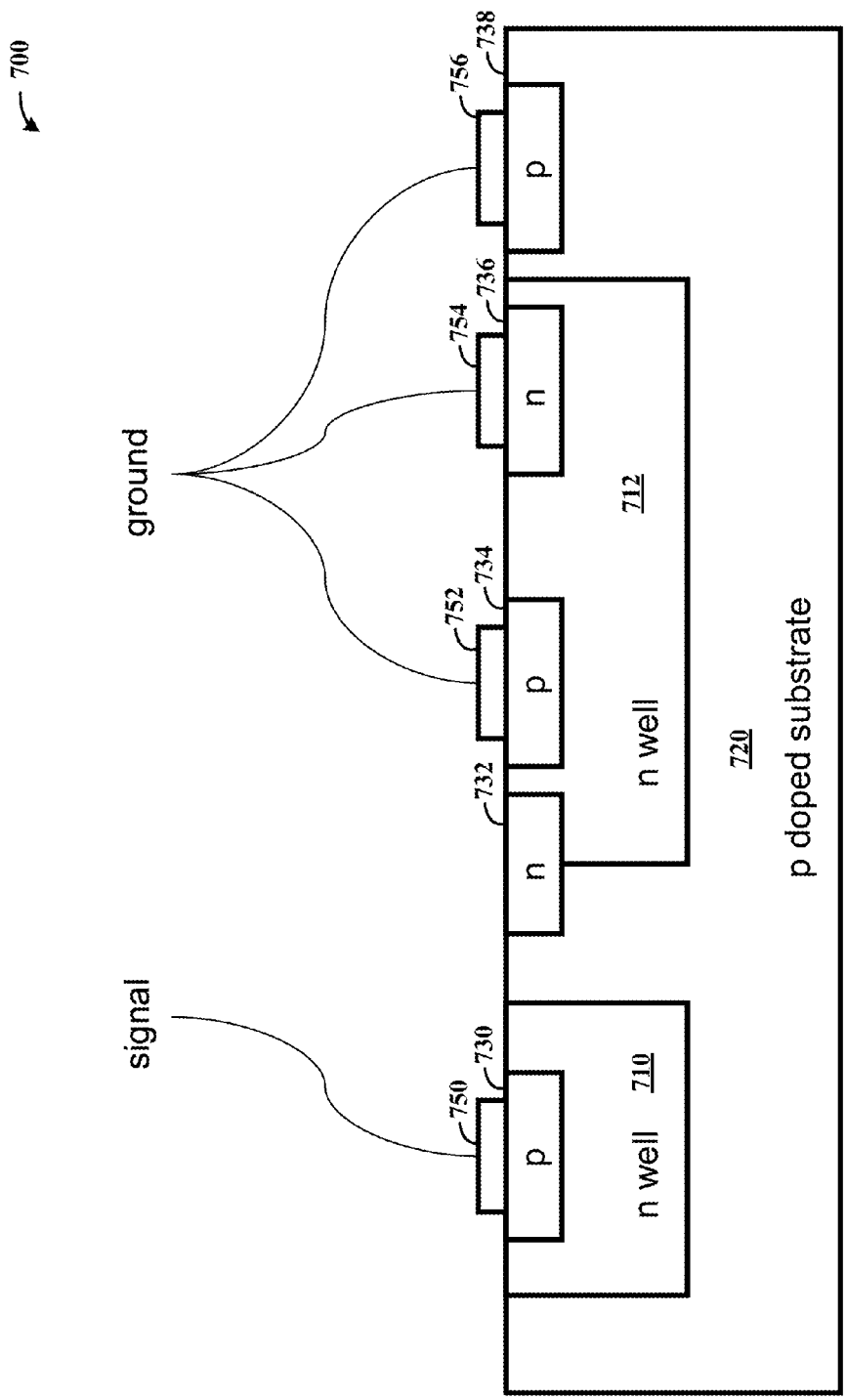
FIG. 7 shows schematic cross section of a protection circuit with floating base and resister between an emitter and ground, in accordance with another example embodiment of the present invention.

FIG. 7 shows schematic cross section of a protection circuit 700 having a thyristor and a diode as described herein, with floating base and resister between an emitter and ground, in accordance with another example embodiment. The circuit 700 may, for example, be implemented in accordance with the structure shown in FIGS. 11A and 11B (e.g., without resistor 1150). The circuit 700 includes n-wells 710 and 712 within a p-doped substrate 720. Alternating n-type and p-type regions 730, 732, 734, 736 and 738 are located in the n-wells and/or p-doped substrate as shown. Contact 750 for n-type region 730 is connected to a signal terminal. Contacts 752, 754 and 756, respectively for p-type region 734, n-type region 736 and p-type region 738, are connected to a ground terminal. Here, p-type region 730, n-well 710 and p-doped substrate 720 form a pnp-transistor of the thyristor, with the base of a pnp-transistor (n-well 710) floating. N-well 710, p-doped substrate 720 and the n-type region 732 with the n-well 712 form an npn-transistor, which forms the thyristor (with the pnp-transistor). The emitter of the npn-transistor is connected to the ground terminal via a resistor (n-well 712).

Figure 8:
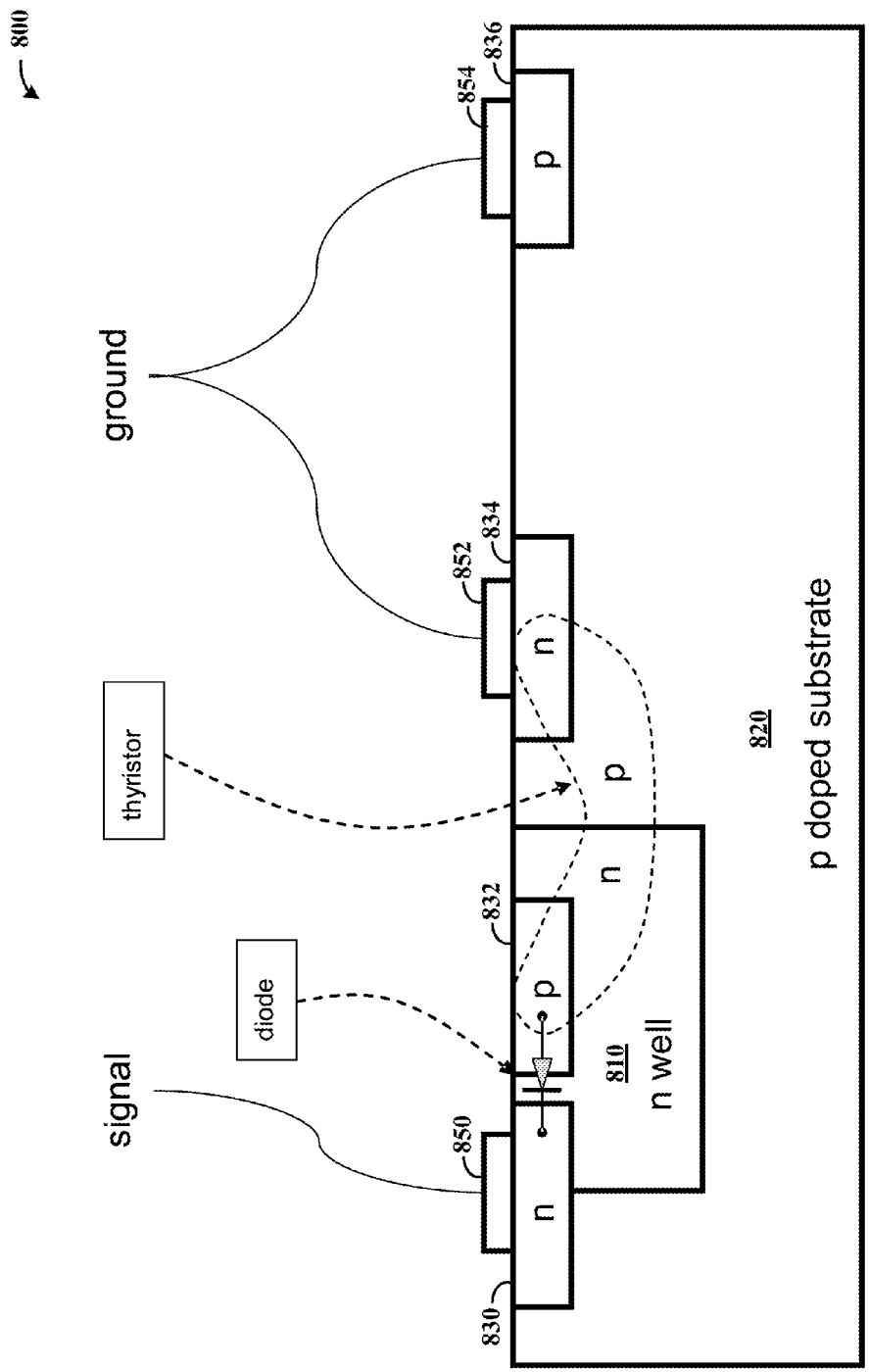
FIG. 8 shows schematic cross section of a protection circuit with a diode between an SCR and an internal node, in accordance with another example embodiment of the present invention.

FIG. 8 shows schematic cross section of a protection circuit 800 with a diode between an SCR (thyristor) and an internal circuit terminal, in accordance with another example embodiment. The circuit 800 includes n-well 810 within a p-doped substrate 820. Alternating n-type and p-type regions 830, 832, 834 and 836 are located in the n-well 810 and/or p-doped substrate 820 as shown. Contact 850 connects n-type region 830 to a signal terminal, and contacts 852 and 854, respectively for n-type region 834 and p-type region 836, are connected to a ground terminal. The p-type region 832, n-well 810, p-doped substrate 820 and n-type region 834 form the SCR, and the n-type region 830 and p-type region 832 form the diode.

Figure 9:
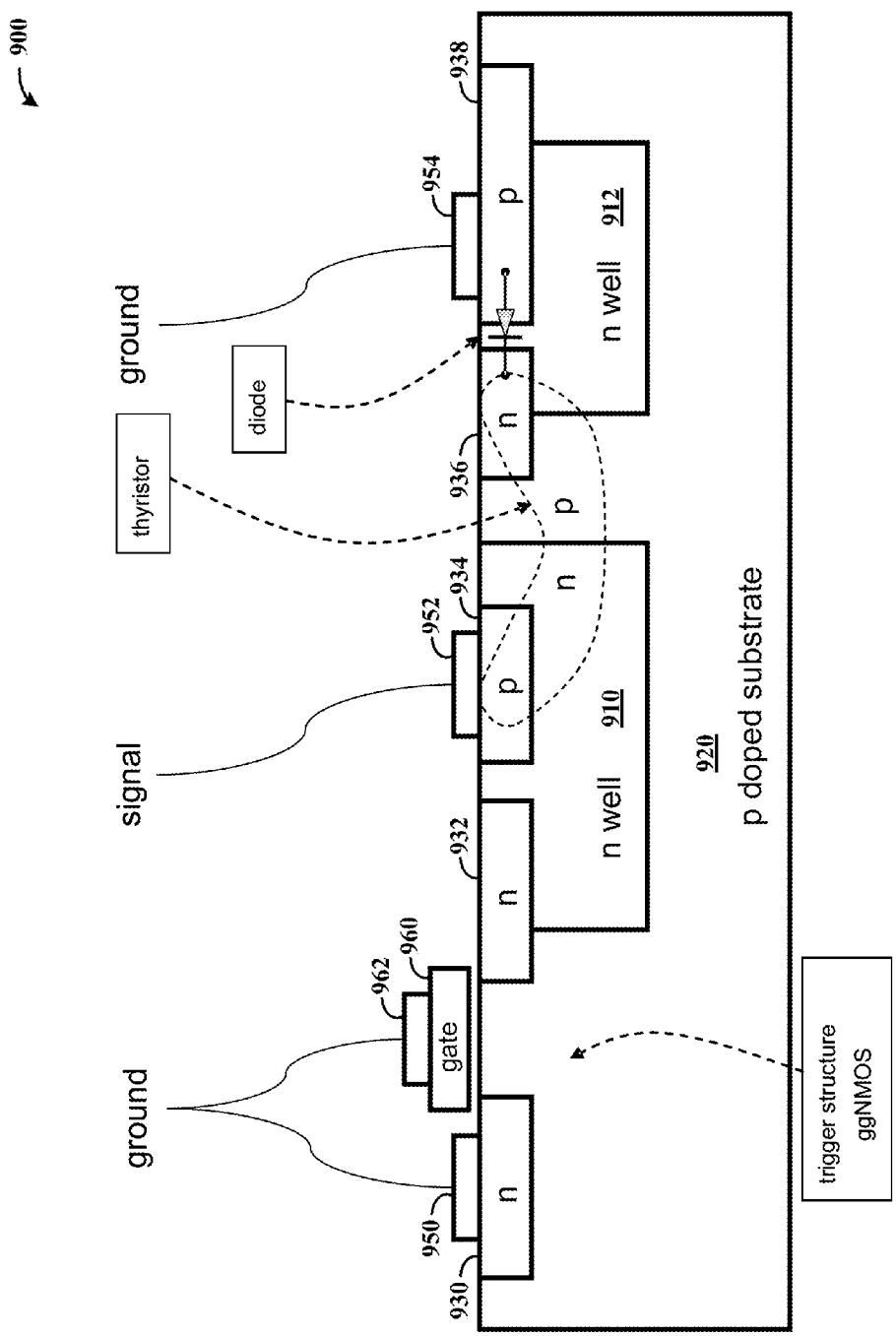
FIG. 9 shows a cross section of a protection circuit having a trigger, in accordance with another example embodiment of the present invention.

FIG. 9 shows a cross section of a protection circuit 900 having a trigger structure that can be used to lower the trigger voltage for a thyristor in series with a diode as shown in and discussed herein, in accordance with another example embodiment. The circuit 900 includes n-wells 910 and 912 within a p-doped substrate 920. N-type and p-type regions 930, 932, 934, 936 and 938 are located in the n-wells and/or p-doped substrate as shown. A gate 960 acts as a trigger structure between n-type regions 930 and 932. Contacts 950, 954 and 962 respectively connect n-type region 930, gate 960 and p-type region 938 to one or more ground terminals. Contact 952 connects p-type region 934 to a signal terminal. P-type region 934, n-well 910, p-doped substrate 920 and n-type region 936 form the thyristor. While the circuit 900 is shown with a specific trigger structure, a variety of other trigger-type circuits can be used in accordance with one or more embodiments herein, with similar functionality.

Figure 10:
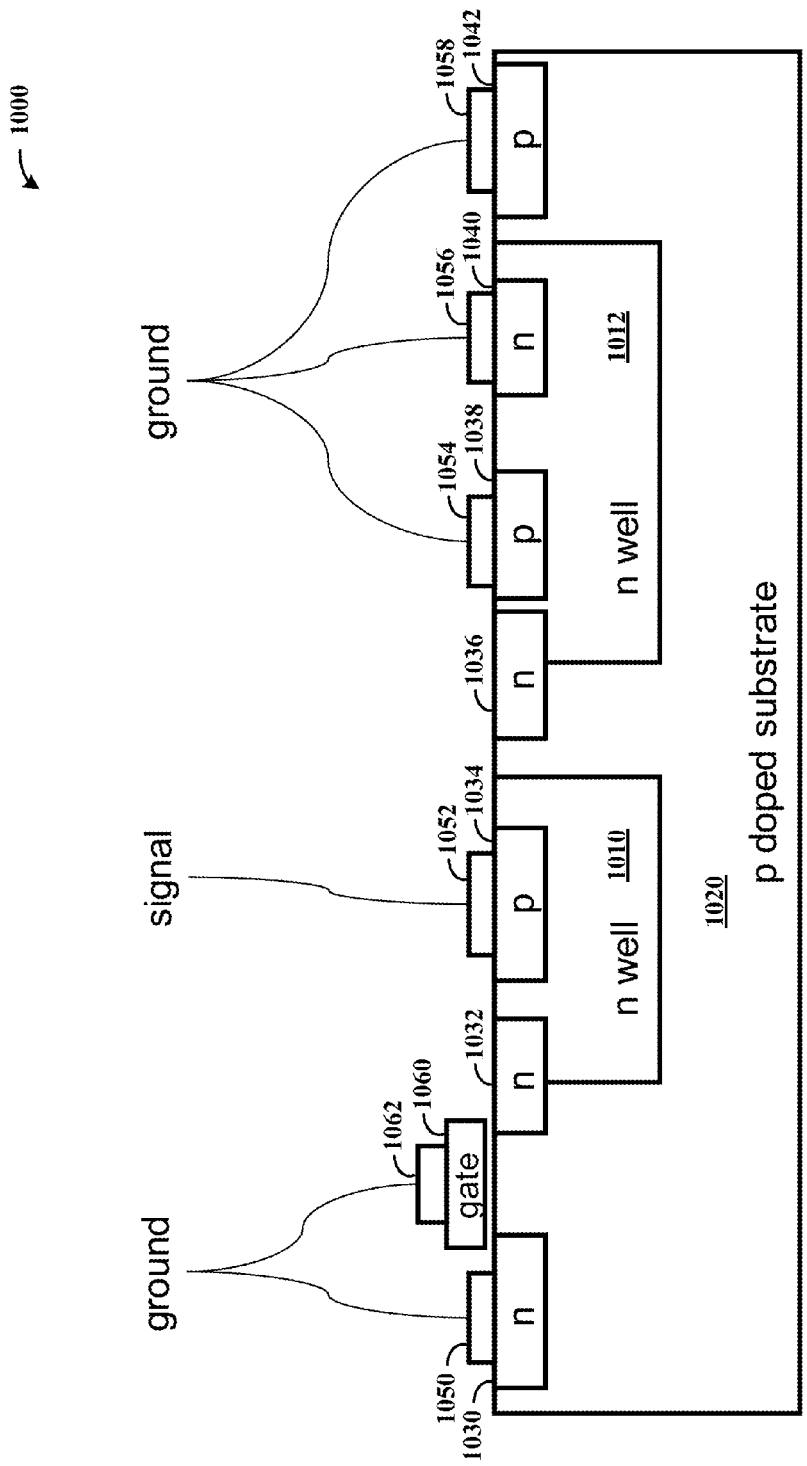
FIG. 10 shows a cross section of another protection circuit having a trigger structure that can be used to lower the trigger voltage for a thyristor in series with a diode, in accordance with another example embodiment of the present invention.

FIG. 10 shows a cross section of another protection circuit 1000 having a trigger structure that can be used to lower the trigger voltage for a thyristor in series with a diode as shown in and discussed herein, in accordance with another example embodiment. The circuit 1000 includes n-wells 1010 and 1012 within a p-doped substrate 1020. N-type and p-type regions 1030, 1032, 1034, 1036, 1038, 1040 and 1042 are located in the n-wells and/or p-doped substrate as shown. A gate 1060 acts as a trigger structure between n-type regions 1030 and 1032. Contacts 1050, 1054, 1056, 1058 and 1062 respectively connect n-type regions 1030 and 1040, gate 1060 and p-type regions 1038 and 1042 to one or more ground terminals. Contact 1052 connects p-type region 1034 to a signal terminal.

FIGS. 11A and 11B respectively show a schematic 1110 and structure 1120 of a protection circuit with a diode and resistor in parallel between a thyristor-based circuit and a ground terminal (or other voltage level), in accordance with another example embodiment. The thyristor-based circuit includes PNPN regions 1132, 1134, 1136 and 1138 as shown in FIG. 11B, and is also represented by bipolar transistors 1112 and 1114 in FIG. 11A. The diode includes PN regions 1138 and 1142 as shown in FIG. 11B, and is also represented in FIG. 11A by diode 1116. The N-type region 1134 (at the base of BJT 1112) is connected to the signal line via resistor 1150. The P-type region 1136 (at the base of the BJT 1114) is connected to the ground terminal via resistor 1152. Resistor 1154 is connected to ground in parallel with the diode 1116.

FIG. 12 shows a cross section of another protection circuit 1200, in accordance with another example embodiment. The circuit 1200 includes an n-epi region 1210 within a p-doped substrate 1220. N-type and p-type regions 1230, 1232, 1234, 1236 and 1038 are located in the n-epi region 1210. Contacts 1250 and 1252 respectively connect n-type (emitter) region 1230 p-type thyristor region 1234 to a signal terminal. Contact 1254 connects p-type (base contact) region 1238 to a ground terminal. As consistent with the circuit 1200, various embodiments herein as shown in connection with a CMOS-type process can be implemented with other approaches, such as bipolar type approaches. Accordingly, embodiments herein described in connection with a CMOS-type process are implemented in connection with a bipolar-type process, in accordance with various other example embodiments.

FIG. 13 shows a plot of the operation of a protection circuit including a diode and thyristor in series, in accordance with another example embodiment of the present invention. The plot shown in FIG. 13 may, for example, be implemented using one or more apparatuses as discussed herein. Current is shown in the vertical scale, with bias voltage on the horizontal scale.

As shown at portion 1310, the device operates in an off, or non-conducting, state in which current is limited by the leakage current of the thyristor. Voltage is smaller than breakdown voltage of the thyristor (than breakdown voltage of a trigger component of the thyristor). Current is very small, as defined by the leakage current of the trigger component of the thyristor (e.g., the leakage of an n-well to substrate, or of a central n-p junction as consistent with the earlier figures).

At 1320, the bias voltage is higher than the breakdown voltage of thyristor (e.g., of n-well to p-substrate, of a central n-p-junction or base-collector junction of a pnp-transistor, or of a collector-base junction of an npn-transistor. Using FIGS. 3A and 3B as an example, current flows through resistor 350, central n-p-junction 334/336 and resistor 352. This is similar to the current path in the off-state at 1310, with the difference being that the voltage drop across the resistors 350 and 352 is bigger, yet the voltage drop across resistor 350 is smaller than the forward voltage of the top p-n-junction (332/334).

At 1330 and again referring to FIGS. 3A and 3B, the current is higher such that the voltage drop across resistor 350 is high enough to forward bias the top p-n junction (332/334), the voltage drop across the resistor 352 is high enough to force current through the diode 316 (n-p regions 338, 342), effectively forward biasing the base-emitter diode of the BJT 314 in series with the (zener) diode 316.

When one or two of the emitter-base diodes is forward biased, and the forward current is high enough the thyristor switches from the off-state (high-ohmic-state) to its on-state or (low ohmic state). When this happens, the externally applied bias (less the clamping voltage of the thyristor) drives the diode 316 into breakdown and forces current through the diode, with the device switching to the state at 1340 or 1350. Effectively, 1350 represents the on-state of the device as discussed above, with the main current flowing as shown by dashed line 380 in FIG. 3B. The total clamping voltage is the sum of the clamping voltages of the thyristor (312/314) and the diode (316), with a small amount of current flowing through the resistors 350 and 352.

State 1340 is a holding point at which a threshold/minimal type of current (e.g., holding current, at a corresponding holding voltage) exists to keep the device in a low-ohmic state. If the external bias is able to deliver the holding current, the low ohmic state will be held. If the external bias is not able to support the holding current, the device switches to the high ohmic state 1330, and to 1320 and 1310 (depending on the voltage delivered by the external source). The holding current is influenced by the current gains of the two transistors 312/314 within the thyristor, and by the resistance values of resistors 350 and 352. Illustratively spoken, part of the holding current is flowing through resistors 350 and 352, and if enough current doesn't flow through these two resistors, they effectively/partially short the junctions within the thyristor and stop the thyristor effect.

FIG. 14 shows a plot of current versus voltage for a protection circuit having a thyristor and zener diode in series, in accordance with another example embodiment of the present invention. Respective trigger and holding current levels are represented at 1410 and 1420, and trigger and holding voltages are represented at 1430 and 1440.

Based upon the above discussion and illustrations, those skilled in the art will readily recognize that various modifications and changes may be made to the present invention without strictly following the exemplary embodiments and applications illustrated and described herein. For example, the respective functions of the thyristor-based circuits and diode circuits as described herein. Such modifications do not depart from the true spirit and scope of the present invention, including that set forth in the following claims.

What is claimed is:

1. A circuit comprising:
   a thyristor-based circuit having anode and cathode end regions separated by two base regions;
   a first resistor connected between one of the base regions and one of an internal circuit terminal and a reference terminal; and
   a diode-based circuit connected in series with the thyristor-based circuit, the diode-based circuit and the thyristor-based circuit being connected between the internal circuit terminal and the reference terminal, the diode-based circuit being configured and arranged with the thyristor-based circuit to
      operate in a first mode at which a voltage between the internal circuit and reference teiminals is below a first voltage level at which the thyristor-based circuit breaks down,
      transition between the first mode and a second mode in response to a voltage spike by applying the spike voltage across the base regions and therein transitioning the thyristor-based circuit into a forward-biased mode, and
      operate in the second mode in which the voltage between the internal circuit and reference terminals exceeds the first voltage level, in which the thyristor-based circuit operates in the forward-biased mode and the diode operates in a breakdown mode to conduct current between the internal circuit terminal and reference terminal, the second mode having a holding voltage that is based upon a sum of a breakdown voltage of the diode-based circuit and a holding voltage for maintaining the thyristor-based circuit in the forward-biased mode, wherein the current passed between the internal circuit terminal and reference circuit terminal in each of the first and second modes and the transition therebetween being limited to current passed through a p-n junction between the base regions.

2. The circuit of claim 1, further including a second resistor connected between the other one of the base regions and the other one of the internal circuit terminal and the reference terminal, wherein the thyristor-based circuit, resistors and diode-based circuit are configured and arranged to
   in the first mode, restrict leakage current flow between the internal circuit terminal and reference terminal to current flow through the resistors and base regions of the thyristor, and
   in the second mode, shunt current between the internal circuit terminal and reference terminal through the thyristor-based circuit and diode-based circuit.

3. The circuit of claim 1, wherein the thyristor-based circuit, resistor and diode-based circuit are configured and arranged to operate in the second mode by
   in response to the voltage exceeding the first voltage level, switching the thyristor into the forward-biased mode to drive the diode into the breakdown mode and force current through the diode, and
   after driving the diode into the breakdown mode and forcing current through the diode, operate at the holding voltage, the holding voltage being below the first voltage level and being high enough to maintain the circuit in a low-ohmic state in which current passes through the thyristor-based and diode-based circuits.

4. The circuit of claim 1, wherein the thyristor-based circuit is configured and arranged to, in the first mode, limit leakage current through the diode-based circuit to a current level that is less than half a leakage current level of the diode-based circuit.

5. The circuit of claim 1, wherein the diode-based circuit is configured and arranged to switch to a current-passing state in response to a voltage level at the internal circuit terminal exceeding a threshold voltage that switches the thyristor-based circuit into the forward-biased mode, and to shunt current from the internal circuit terminal to the reference terminal via the thyristor-based circuit.

6. The circuit of claim 1, wherein the diode-based circuit includes at least one diode and is connected between the internal terminal and the thyristor-based circuit.

7. The circuit of claim 1, wherein the diode-based circuit includes anode and cathode regions of opposite polarity, the cathode being connected to the internal terminal and the anode including at least a portion of the anode end region of the thyristor-based circuit.

8. The circuit of claim 1, wherein the diode-based circuit is connected between the thyristor-based circuit and the reference terminal.

9. The circuit of claim 1, wherein the diode-based circuit includes anode and cathode regions of opposite polarity, the anode being connected to the reference terminal and the cathode including at least a portion of the cathode end region of the thyristor-based circuit.

10. The circuit of claim 1, wherein the thyristor-based circuit is configured and arranged to switch to a current-passing state in response to an internal p-n junction of the thyristor breaking down, a voltage across the thyristor-based circuit being less than 1 V in the current-passing state, and the diode is configured and arranged to switch to a current-passing state in response to a voltage across the diode-based circuit that is greater than 2 V.

11. The circuit of claim 1, further including a trigger circuit configured and arranged to lower a trigger voltage at which the thyristor-based circuit switches to the forward-biased mode.

12. For use in a circuit including an internal circuit terminal subject to at least one of an overvoltage, overcurrent or electrostatic discharge condition, a protection circuit comprising:
    first and second resistors; and
    a plurality of doped regions of opposite polarity forming p-n junctions therebetween, the plurality of doped regions including
        a thyristor-based circuit having an anode and a cathode separated by two base regions, the first resistor being between one of the base regions and the internal circuit terminal, the second resistor being between another one of the base regions and reference terminal, the circuit being configured and arranged to switch to a breakdown state in response to a voltage drop across one of the resistors being higher than a forward voltage of a p-n junction between an anode of the thyristor and one of the base regions immediately adjacent the anode, and
        a diode-based circuit having an anode and a cathode, one of the anode and cathode including one of the anode and cathode of the thyristor-based circuit, and the other one of the anode and cathode being connected to one of the internal circuit terminal and reference terminal, the diode-based circuit being configured and arranged with the thyristor-based circuit to,
            in a first mode at which a voltage at the p-n junction is below the forward voltage, limit current flow between the internal circuit terminal and reference terminal to a leakage current through a p-n junction between the base regions
            in a second mode, respond to the forward voltage being presented to the p-n junction by switching to a low-resistance state in which the p-n junction operates in a forward-biased state and flowing current between the internal circuit terminal and reference terminal, and
            in a third mode, after switching to the low-resistance state, operate in a hold state and continuing to flow current between the internal circuit terminal and reference terminal in response to the voltage between the internal circuit terminal and reference terminal remaining above a holding voltage that is based upon a sum of clamping voltages of the thyristor-based and diode-based circuits.

13. The protection circuit of claim 12, wherein the thyristor-based circuit is configured and arranged to operate in the first mode by limiting leakage current through the diode-based circuit to a current level that is less than half a leakage current level of the diode-based circuit.

14. The protection circuit of claim 12, wherein
    the cathode of the diode-based circuit is connected to the internal circuit terminal,
    the anode of the diode-based circuit is shared with the anode of the thyristor-based circuit, and
    the cathode of the thyristor-based circuit is connected to the reference terminal.

15. The protection circuit of claim 12, wherein
    the anode of the diode-based circuit is connected to the reference terminal,
    the cathode of the diode-based circuit is shared with the cathode of the thyristor-based circuit, and
    the anode of the thyristor-based circuit is connected to a node of the internal circuit terminal.

16. The protection circuit of claim 12, further including a trigger circuit connected to one of the base regions of the thyristor-based circuit and configured and arranged to lower a trigger voltage at which the p-n junction switches to the forward-biased state.

17. The protection circuit of claim 12, wherein the thyristor-based circuit, resistors and diode-based circuit are configured and arranged to restrict current flow in each of the three modes and in transitions therebetween to current flowing via a p-n junction between the base regions, by
    in the first mode, restrict leakage current flow between the internal circuit terminal and reference terminal to current flow through the resistors and base regions of the thyristor, and
    in the second and third modes, shunt current between the internal circuit terminal and reference terminal through all of the plurality of doped regions.

18. The protection circuit of claim 12, wherein the thyristor-based circuit, resistors and diode-based circuit are configured and arranged to
    in the second mode, flow current through the first resistor, the base regions of the thyristor and the diode, and
    in third mode, flow current between the internal circuit terminal and the reference terminal through all the plurality of doped regions, and through the resistors.

19. A protection circuit comprising:
    a thyristor;
    a first resistor connected between a first base region of the thyristor and an internal circuit terminal susceptible to an overcurrent or overvoltage condition;
    a second resistor connected between a second base region of the thyristor and a reference terminal; and
    a diode connected in series with the thyristor between the internal circuit terminal and the reference terminal, one of the thyristor and diode being directly connected to the internal circuit terminal and the other of the thyristor and diode being directly connected to the reference terminal, the thyristor, resistors and diode being configured and arranged with one another to
        operate in a first mode in which a voltage presented at the internal circuit terminal is insufficient to forward bias a p-n junction of the thyristor, and in which leakage current between the internal circuit terminal and reference terminal is limited to a leakage current through a p-n junction between the base regions,
        operate in a second breakdown mode in response to a breakdown voltage presented at the internal circuit terminal causing the p-n junction of the thyristor to switch to a forward biased state, by switching the diode into a breakdown state and conducting current between the internal circuit terminal and the reference terminal, and
        operate in a third holding mode, after switching the diode into the breakdown state, by continuing to conduct current between the internal circuit terminal and the reference terminal in response to a voltage presented at the internal circuit terminal being at least as high as a holding voltage having a value that is a sum of clamping voltages of the thyristor and diode, and less than the breakdown voltage.

20. The circuit of claim 19, wherein
    the first resistor is directly connected between the first base region and the internal circuit terminal, the second resistor is directly connected between the second base region and the reference terminal, the thyristor and diode are configured and arranged to enter and operate in the breakdown mode by, in response to the breakdown voltage, flowing current through one of the resistors, a base and emitter region of the thyristor and the diode.

21. The circuit of claim 2, wherein the thyristor-based circuit, resistors and diode-based circuit are configured and arranged to operate in the second mode with a holding current that flows through the thyristor at the holding voltage being based upon current gain within the thyristor-based circuit and by resistance values of the first and second resistors, the first and second resistors being configured and arranged to flow at least part of the holding current and to at least partially short junctions within the anode and cathode end regions of the thyristor in response to a drop in current below the holding current.

* * * * *